(12) United States Patent
Ogawa et al.

(10) Patent No.: US 7,165,235 B2
(45) Date of Patent: *Jan. 16, 2007

(54) EXPOSURE PATTERN FORMING METHOD AND EXPOSURE PATTERN

(75) Inventors: Kazuhisa Ogawa, Kanagawa (JP); Hidetoshi Ohnuma, Kanagawa (JP)

(73) Assignee: Sony Corporation (JP)

( * ) Notice: Subject to any disclaimer, the term of this patent is extended or adjusted under 35 U.S.C. 154(b) by 95 days.

This patent is subject to a terminal disclaimer.

(21) Appl. No.: 11/101,479

(22) Filed: Apr. 8, 2005

(65) Prior Publication Data

US 2005/0174557 A1 Aug. 11, 2005

Related U.S. Application Data

(63) Continuation of application No. 10/297,211, filed as application No. PCT/JP02/02992 on Mar. 27, 2002, now Pat. No. 7,000,216.

(30) Foreign Application Priority Data

Apr. 4, 2001 (JP) .............................. 2001-105355

(51) Int. Cl.
G06F 17/50 (2006.01)
(52) U.S. Cl. .............................. 716/21; 716/19; 716/20
(58) Field of Classification Search ................... 716/19, 716/20, 21
See application file for complete search history.

(56) References Cited

U.S. PATENT DOCUMENTS 5,208,124 A 5/1993 Sporon-Fiedler et al.
5,553,273 A 9/1996 Liebmann
6,077,310 A * 6/2000 Yamamoto et al. .......... 716/19
6,243,855 B1 6/2001 Kobayashi et al.

FOREIGN PATENT DOCUMENTS

| JP | 5-80486 | 4/1993 |
| JP | 8-28358 | 11/1996 |
| JP | 10-189409 | 7/1998 |
| JP | 11-168065 | 6/1999 |

* cited by examiner

Primary Examiner—Thuan Do
(74) Attorney, Agent, or Firm—Ronald P. Kananen; Rader Fishman & Grauer PLLC

(57) ABSTRACT

The present invention provides an exposure pattern forming method using a rule-based proximity effect correction method to which graphic form arithmetic operation is applied. Disclosed is an exposure pattern forming method of forming an exposure pattern by correcting each of pattern portions constituting a design pattern by a correction amount, which amount is previously prepared so as to correspond to both a line width of the pattern portion and a space width of a space portion adjacent to the pattern portion, characterized by including the steps of: subjecting the design pattern to graphic form arithmetic operation, to extract each of the pattern portions for each of target line widths, and to extract each of the space portions for each of target space widths (ST2, ST3); and subjecting each of the pattern portion extracted for each of the target line widths and the space portion extracted for each of the target space widths to graphic form arithmetic operation based on the corresponding one of the correction amounts, to thereby correct the pattern portion having each of the target line widths for each of the target space widths (ST4 to ST9).

2 Claims, 7 Drawing Sheets

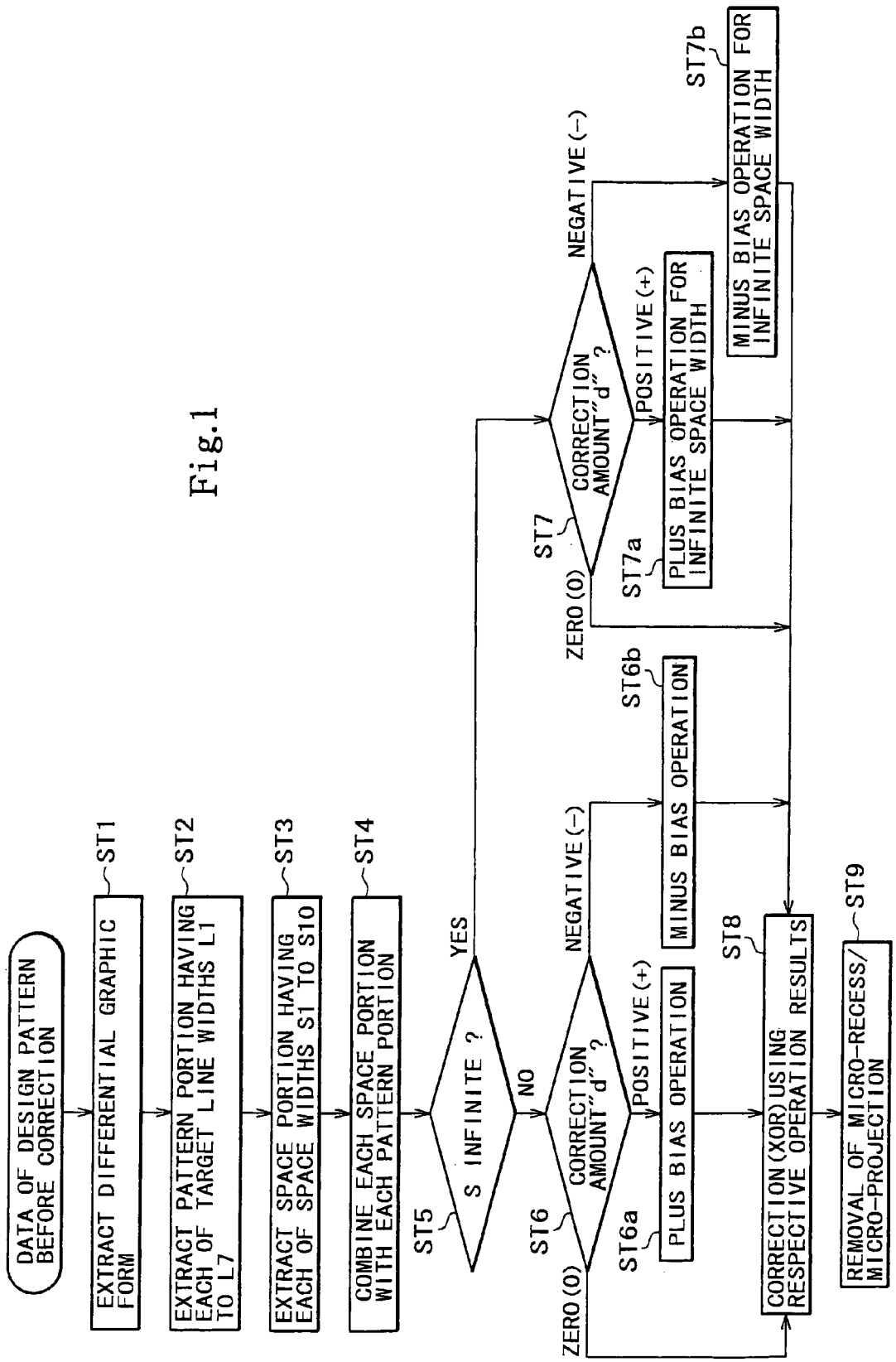

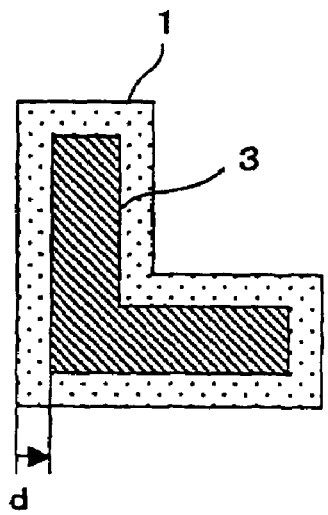
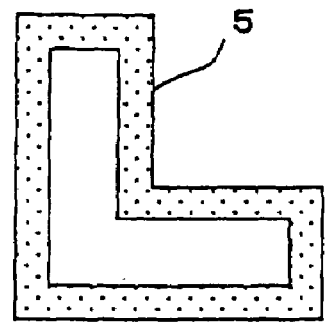
Fig.2A　　　　　　　　Fig.2B
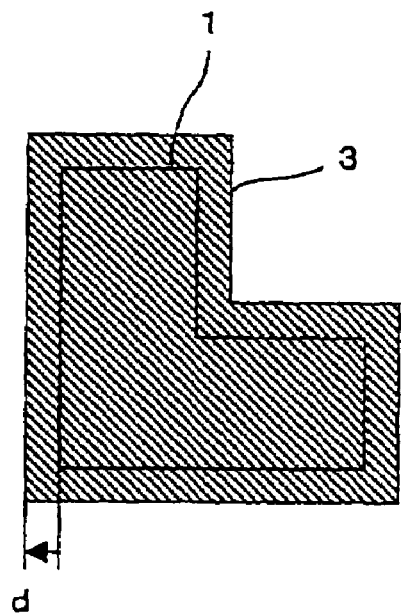
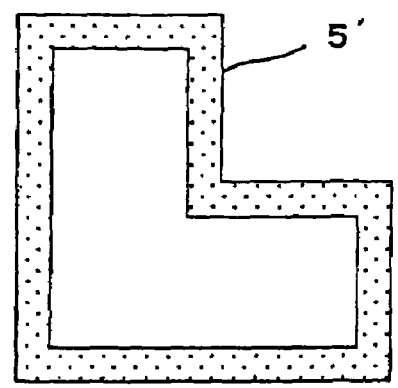
Fig.3A　　　　　　　　Fig.3B

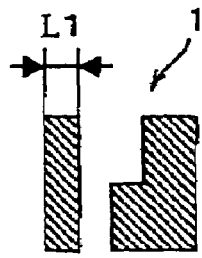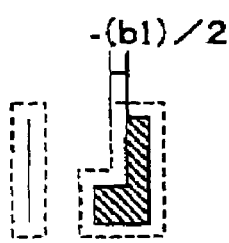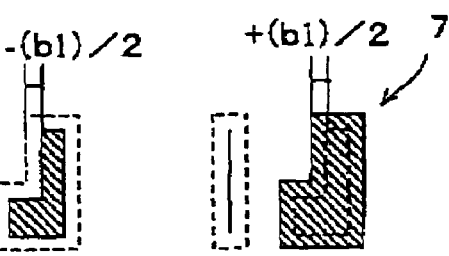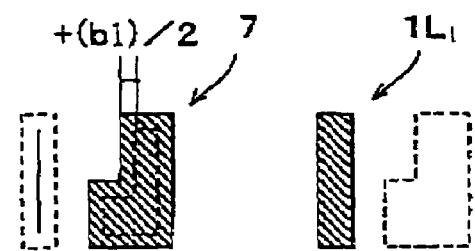
Fig.4A  Fig.4B  Fig.4C  Fig.4D
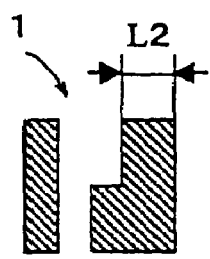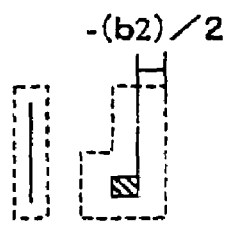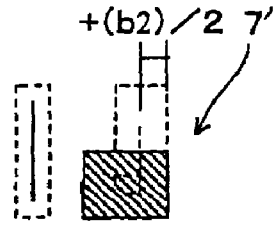
Fig.5A  Fig.5B  Fig.5C
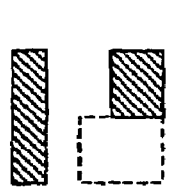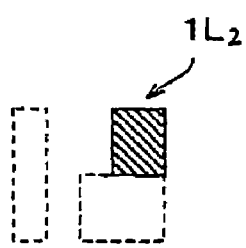
Fig.5D  Fig.5E

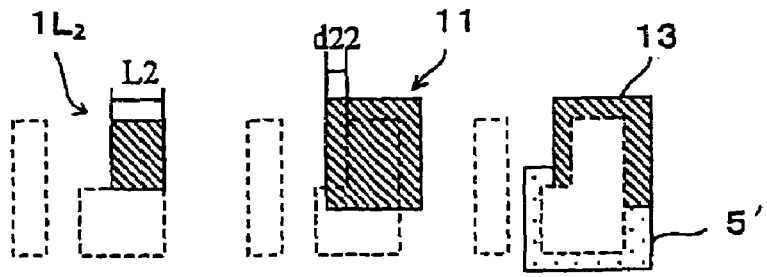
Fig.8A  Fig.8B  Fig.8C
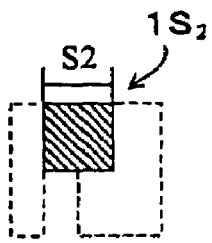 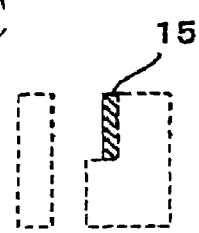
Fig.8D  Fig.8E
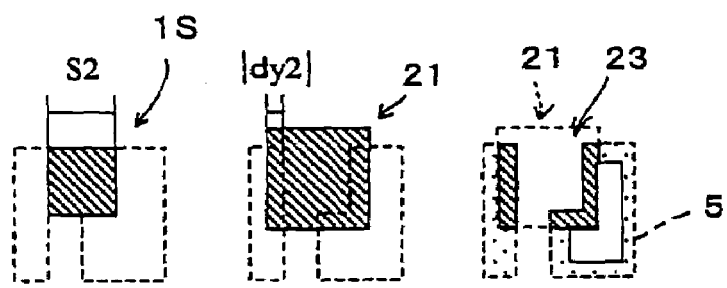
Fig.9A  Fig.9B  Fig.9C
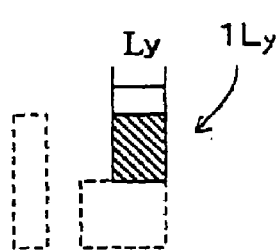 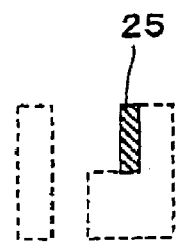
Fig.9D  Fig.9E

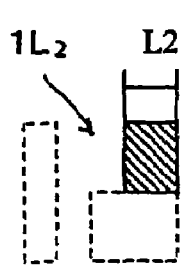 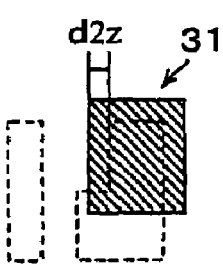 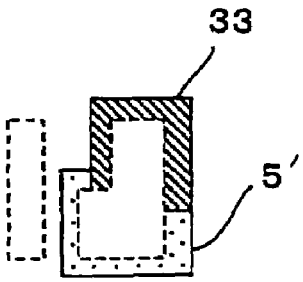 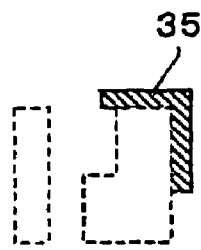
Fig.10A　Fig.10B　Fig.10C　Fig.10E
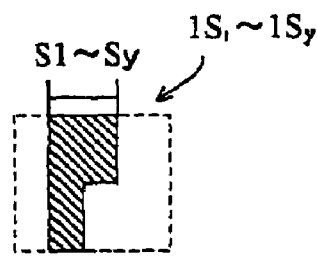
Fig.10D
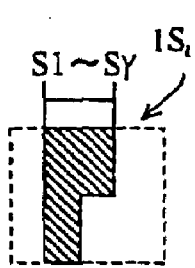 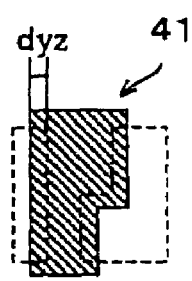 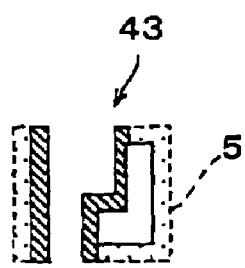 
Fig.11A　Fig.11B　Fig.11C　Fig.11F
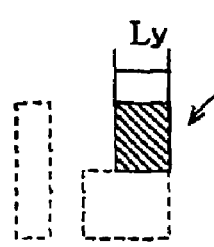 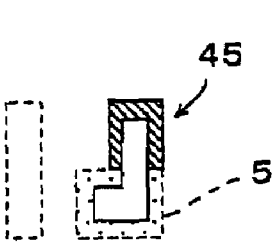
Fig.11D　Fig.11E

EXPOSURE PATTERN FORMING METHOD AND EXPOSURE PATTERN

This application is a continuation application of U.S. application Ser. No. 10/297,211, filed Dec. 3, 2002 now U.S. Pat. No. 7,000,216, which application is a National Phase of application no. PCT/JP02/02992, filed Mar. 27, 2002, which application claims foreign priority from JP2001-105355. The contents of each of these applications are hereby incorporated by reference.

TECHNICAL FIELD

The present invention relates to an exposure pattern forming method and an exposure pattern formed by the method, and particularly to an exposure pattern forming method to which a rule-based proximity effect correction method is applied and an exposure pattern formed by the method.

BACKGROUND ART

In fabrication of semiconductor devices, resist patterns are used as masks for ion implantation and pattern etching.

With respect to such resist patterns obtained by photolithography and transfer patterns formed from the resist patterns by etching, it is known that variations in dimensional accuracy may occur due to various factors such as process conditions, arrangement densities of the patterns, and underlying conditions. Such variations in dimensional accuracy may cause defects such as short-circuit between the patterns and disconnection of the patterns.

In recent years, an attempt has been made to obtain transfer patterns closer to design patterns by correcting designed pattern in accordance with a so-called optical proximity effect correction (hereinafter, referred to as "OPC") method. One type of the OPC method is known as a rule-based OPC, wherein a correction amount corresponding to both a line width of each pattern portion of a design pattern and a space width of a space portion adjacent to the pattern portion is extracted by searching a previously prepared correction table, and the pattern portion is corrected by the correction amount thus extracted.

One specific method of extracting a correction amount corresponding to each pattern portion of a design pattern by using the rule-based OPC method is known as that using a DRC (Design Rule Checker). In the method using the DRC, each pattern having a target line width or each space portion having a target space width is extracted by setting a flag at an edge of a design pattern, depicting a circle having a radius equivalent to a target distance (target line width or target space width) around the flag, and sampling a portion with its edge portion contained in the circle as a target pattern portion or a target space portion. Each pattern portion of the design pattern is then corrected by a correction amount corresponding to both the sampled pattern portion and the space portion.

The method of extracting the target pattern portion and the target line width portion using the DRC, however, has the following problem. Referring to FIG. 14, at a portion between two pattern portions 101, in which the space width is changed between target space widths S1 and S2, according to the method using the DRC, a calculated edge portion, which is extracted as that having the target space width S1, is protruded outwardly from an actual edge portion. Accordingly, the portion in which the space width is changed between the values S1 and S2 cannot be accurately corrected. In other words, there may occur a partial deviation between the correction amount given to the above portion and a correction amount required for the portion.

In the case of forming a transfer pattern on a substrate by photolithography using an exposure pattern corrected on the basis of the above-described erroneous extraction, there may occur a defect such as short-circuit or disconnection of the transfer pattern at the above-described portion partially deviated from the design pattern. Up until now, it has failed to certainly solve the above-described problem of the method using the DRC.

In view of the foregoing, an object of the present invention is to provide an exposure pattern forming method capable of forming an exposure pattern by accurately correcting a design pattern, and to provide an exposure pattern formed by the method.

DISCLOSURE OF INVENTION

To achieve the above object, according to the present invention, there is provided an exposure pattern forming method of forming an exposure pattern by correcting each of pattern portions constituting a design pattern by a correction amount, which amount is previously prepared so as to correspond to both a line width of the pattern portion and a space width of a space portion adjacent to the pattern portion, characterized by including the steps of: subjecting the design pattern to graphic form arithmetic operation, to extract each of the pattern portions for each of target line widths, and to extract each of the space portions for each of target space widths; and subjecting each of the pattern portion extracted for each of the target line widths and the space portion extracted for each of the target space widths to graphic form arithmetic operation based on the corresponding one of the correction amounts, to thereby correct the pattern portion having each of the target line widths for each of the target space widths. The present invention also provides an exposure pattern formed by the method.

According to the exposure pattern forming method and the exposure pattern, a pattern portion having each of target line widths and a space portion having each of target space widths are extracted by graphic form arithmetic operation. Accordingly, a pattern portion having a target dimension and a space portion having a target dimension can be accurately extracted irrespective of the arrangement states of the pattern portion and the space portion. Each of the extracted portions is then subjected to graphic form arithmetic operation based on the corresponding correction amount, to thus correct the design pattern. As a result, since the design pattern is corrected only by graphic form arithmetic operation without use of any special measurement method, any pattern portion can be corrected irrespective of the shape of the design pattern.

BRIEF DESCRIPTION OF DRAWINGS

FIG. 1 is a flow chart illustrating a pattern forming method of the present invention;

FIGS. 2A and 2B are views showing a procedure of obtaining a minus differential graphic form between a design pattern and a correction pattern obtained by correcting the design pattern by each minus correction amount in accordance with the pattern forming method of the present invention;

FIGS. 3A and 3B are views showing a procedure of obtaining a plus differential graphic form between a design pattern and a correction pattern obtained by correcting the design pattern by each plus correction amount in accordance with the pattern forming method of the present invention;

FIGS. 4A to 4D are views (part 1) illustrating a procedure of extracting a pattern portion having each target line width in accordance with the pattern forming method of the present invention;

FIGS. 5A to 5E are views (part 2) illustrating a procedure of extracting a pattern portion having each target line width in accordance with the pattern forming method of the present invention;

FIGS. 8A to 8E are views (part 1) illustrating a procedure of obtaining a plus bias correction graphic form in accordance with the pattern forming method of the present invention;

FIGS. 9A to 9E are views (part 2) illustrating a procedure of obtaining a minus bias correction graphic form in accordance with the pattern forming method of the present invention;

FIGS. 10A to 10E are views (part 1) illustrating a procedure of obtaining a plus bias correction graphic form of a pattern portion adjacent to a space portion having an infinite space width in accordance with the pattern forming method of the present invention;

FIGS. 11A to 11F are views (part 2) illustrating a procedure of obtaining a minus bias correction graphic form of a pattern portion adjacent to a space portion having an infinite space width in accordance with the pattern forming method of the present invention;

BEST MODE FOR CARRYING OUT THE INVENTION

Figures 6A, 6B, 6C, 6D:
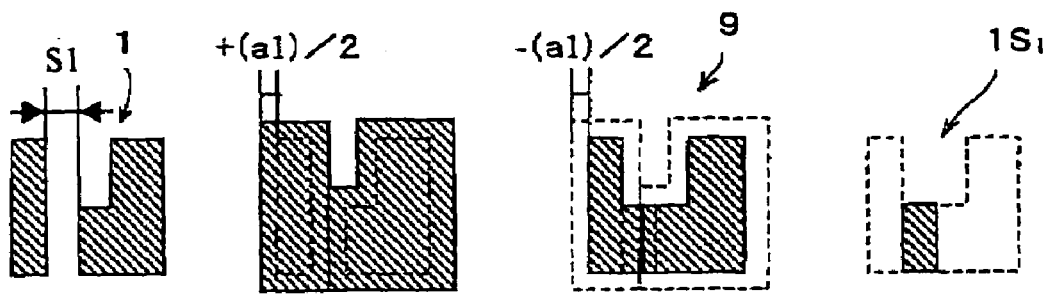
FIGS. 6A to 6D are views (part 1) illustrating a procedure of extracting a space portion having each target space width in accordance with the pattern forming method of the present invention.

An embodiment of the present invention will be hereinafter described with reference to the drawings.

In this embodiment, the present invention is applied to a rule-based OPC method including the steps of extracting a correction amount "d" corresponding to both a line width L (L1 to L7) of each of pattern portions constituting a design pattern and a space width S (S1 to S10) of a space portion adjacent to an edge of the pattern portion by searching previously prepared correction data shown in Table 1, and correcting an edge of a pattern portion of the design pattern by the corresponding correction amount.

TABLE 1

| L\S | $S1 \leq a1$ | $a1 < S2 \leq a2$ | ... | $ax < Sy \leq ay$ | $ay < Sz$ |
|---|---|---|---|---|---|
| $L1 \leq b1$ | d11 | d12 | ... | d1y | d1z |
| $b1 < L2 \leq$ | d21 | * d22 | ... | d2y | d2z |

TABLE 1-continued

| L\S | $S1 \leq a1$ | $a1 < S2 \leq a2$ | ... | $ax < Sy \leq ay$ | $ay < Sz$ |
|---|---|---|---|---|---|
| b2 | | | | | |
| ... | d31 | ... | ... | ... | ... |
| ... | ... | ... | ... | ... | ... |
| $bx < Ly \leq by$ | dy1 | dy2 | ... | dyy | dyz |
| $by < Lz$ | dz1 | dz2 | ... | dzy | dzz |

In Table 1, for example, a value d22 in the middle column given a symbol "*" means that a correction amount "d" of an edge portion, adjacent to a space portion having a space width S2 in a range of $a1<S2 \leq a2$, of a pattern portion having a line width L2 in a range of $b1<L2 \leq b2$ is d22.

FIG. 1 is a flow chart showing an exposure pattern forming method according to the present invention. A procedure of forming an exposure pattern by correcting a design pattern will be described below in the order of procedures shown in the flow chart with reference to FIG. 1 and Table 1, and if needed, other figures.

[First Step ST1]

In the first step ST1, a design pattern (before correction) is corrected by each correction amount "d" shown in Table 1, to obtain a correction pattern, and a differential graphic form between the design pattern and the correction pattern is extracted. For example, as shown in FIG. 2A, for a correction amount d=−10 nm, an edge portion of a design pattern 1 is subjected to reduction correction (undersize correction) in which the edge portion is shifted by an amount of 10 nm in the undersize direction, to prepare a correction pattern 3, and as shown in FIG. 2B, a minus differential graphic form 5 is obtained by subtracting the correction pattern 3 from the design pattern 1.

As shown in FIG. 3A, for a correction amount d=+10 nm, the edge portion of the design pattern 1 is subjected to enlargement correction (oversize correction) in which the edge portion is shifted by an amount of 10 nm in the oversize direction, to prepare a correction pattern 3, and as shown in FIG. 3B, a plus differential graphic form 5' is obtained by subtracting the design pattern 1 from the correction pattern 3.

The above preparation of the set of the differential graphic forms 5 and 5' is repeated for each of the other correction amounts "d" shown in Table 1. If six kinds of the correction amounts "d" are listed in Table 1, six sets of the differential graphic forms 5 and 5' are prepared. It is to be noted that the sets of the differential graphic forms 5 and 5' are to be used for the subsequent graphic form arithmetic operation for correction.

[Second Step ST2]

In the second step ST2, a design pattern is subjected to graphic form arithmetic operation for each of target line widths L of pattern portions constituting the design pattern, to extract each pattern portion as that having the target line width L. Here, since each of the target line widths L1, L2, ... is set to be in a specific range as shown in Table 1, as will be described below, the design pattern is subjected to graphic form arithmetic operation for each target line width in the corresponding specific range, to extract each pattern portion as that having the target line width in the corresponding specific range.

A design pattern 1 shown in FIG. 4A is under-sized by a correction amount equivalent to ½ of an upper limit value (b1) of a range ($L1 \leq b1$) of a minimum level line width L1, to obtain an undersized graphic form shown in FIG. 4B, and the undersized graphic form shown in FIG. 4B is over-sized by the same correction amount, to obtain a correction pattern 7 shown in FIG. 4C. The correction pattern 7 is then subtracted from the design pattern 1, to extract a graphic form as a pattern portion $1L_1$ having the line width L1 in the range of $L1 \leq b1$ as shown in FIG. 4D.

The design pattern 1 shown in FIG. 5A is also under-sized by a correction amount equivalent to ½ of an upper limit value (b2) of a range ($b1<L2\leq b2$) of a next level line width L2, to obtain an undersized graphic form shown in FIG. 5B, and the undersized graphic form shown in FIG. 5B is over-sized by the same correction amount, to obtain a correction pattern 7' shown in FIG. 5C. The correction pattern 7' is then subtracted from the design pattern 1, to obtain a graphic form shown in FIG. 5D. The above pattern portion $1L_1$ in the range of $L1 \leq b1$ is then subtracted from the graphic form shown in FIG. 5D, to extract a graphic form as a pattern portion $1L_2$ having the line width L2 in the range of $b1<L2\leq b2$ as shown in FIG. 5E.

The above-described extraction of the pattern portion is repeated, to thus extract the pattern portions $1L_1, 1L_2, \ldots, 1L_z$ having the target line widths L1, L2, ..., Lz, respectively. In this case, the extraction of the pattern portions is performed in the order from the smaller value of the line width L to the larger value of the line width L.

The extraction of the pattern portions $1L_1, 1L_2, \ldots, 1L_z$ may be performed by extracting the correction pattern 7 shown in FIG. 4C as a pattern portion having a line width larger than b1 and extracting the correction pattern 7' shown in FIG. 5C as a pattern portion having a line width larger than b2. In this case, the extraction of the pattern portions is performed in the order from the larger value of the line width L to the smaller value of the line width L.

To be more specific, the design pattern 1 is under-sized by a correction amount equivalent to ½ of a value "by" and the undersized graphic form is over-sized by the same correction amount, and the resultant graphic form is subtracted from the design pattern 1, to extract a graphic form as a pattern portion having a line width larger the value "by", that is, a pattern portion $1L_y$ having the line width Ly in the range of by<Ly. The design pattern 1 is also under-sized by a correction amount equivalent to ½ of a value (bx) and the undersized graphic form is over-sized by the same correction amount, and the resultant graphic form is subtracted from the design pattern 1, to obtain a graphic form as a pattern portion having the line width larger than bx. The above pattern portion $1L_y$ in the range of by<Ly is then subtracted from the above pattern portion having the line width larger than bx, to extract a graphic form as a pattern portion $1L_x$ having the line width Lx in the range of bx<Lx$\leq$by. In this way, the extraction of the pattern portions is performed in the order from the larger value of the line width L to the smaller value of the line width L.

[Third Step ST3]

In the third step ST3, a design pattern is subjected to graphic form arithmetic operation for each of target space widths S of space portions around the design pattern, to extract each space portion as that having the target space width S. Here, since each of the target space widths S1, S2, ... is set to be in a specific range as shown in Table 1, as will be described below, the design pattern is subjected to graphic form arithmetic operation for each target space width in the corresponding specific range, to extract each space portion as that having the target space width in the corresponding specific range.

A design pattern 1 shown in FIG. 6A is over-sized by a correction amount equivalent to ½ of an upper limit value (a1) of a range ($S1 \leq a1$) of a minimum level space width S1, to obtain an oversized graphic form shown in FIG. 6B, and the oversized graphic form shown in FIG. 6B is under-sized by the same correction amount, to obtain a correction pattern 9 shown in FIG. 6C. The design pattern 1 is then subtracted from the correction pattern 9, to extract a graphic form as a pattern portion $1S_1$ having the space width S1 in the range of $S1 \leq a2$ as shown in FIG. 6D.

Figures 7A, 7B, 7C:
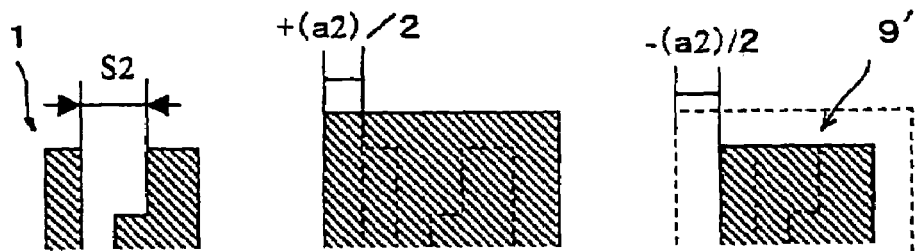
FIGS. 7A to 7E are views (part 2) illustrating a procedure of extracting a space portion having each target space width in accordance with the pattern forming method of the present invention.
Figures 7D, 7E:

The design pattern 1 shown in FIG. 7A is also over-sized by a correction amount equivalent to ½ of an upper limit value (a2) of a range ($a1<S2\leq a2$) of a next level space width S2, to obtain an oversized graphic form shown in FIG. 7B, and the oversized graphic form shown in FIG. 7B is under-sized by the same correction amount, to obtain a correction pattern 9' shown in FIG. 7C. The design pattern 1 is then subtracted from the correction pattern 9', to obtain a graphic form shown in FIG. 7D and the above pattern portion $1S_1$ in the range of $S1 \leq a1$ is subtracted from the graphic form shown in FIG. 7D, to extract a graphic form as a space portion $1S_2$ having the space width S2 in the range of $a1<S2\leq a2$ as shown in FIG. 7E.

The above-described extraction of the space portion is repeated, to thus extract the space portions $1S_1, 1S_2, \ldots, 1S_z$ having the target line widths S1, S2, ..., Sz, respectively. In this case, the extraction of the space portions is performed in the order from the smaller value of the space width S to the larger value of the space width S.

In each of the first, second, and third steps ST1, ST2, and ST3, the extracting order is not limited to that described above but may be freely changed.

[Fourth Step ST4]

In the fourth step ST4, to correct each pattern portion of the design pattern, the pattern portion is combined with a space portion adjacent to each of edges of the pattern portion.

[Fifth Step ST5]

In the fifth step ST5, it is decided whether or not a space portion adjacent to each of all the edges of each pattern portion is infinite. It is to be noted that as shown in Table 1, a space width Sz, which is larger than ay, is taken as being infinite. If the answer in the fifth step ST5 is negative (No), that is, if it is decided that a space portion adjacent to each of all the edges of each pattern portion is not infinite, the process goes on to a sixth step ST6. If the answer in the fifth step ST5 is affirmative (Yes), that is, if it is decided that a space portion adjacent to all the edges of each pattern portion is infinite, the process goes on to a seventh step ST7.

[Sixth Step ST6]

In the sixth step ST6, an edge portion adjacent to a space portion having a space width decided not to be infinite, that is, having a space width in the range of the space width S1 to the space width Sz (exclusive) shown in Table 1 is taken as that to be corrected, and it is decided whether or not the correction amount "d" of the edge portion to be corrected is positive (+), negative (−), or zero (0). If it is decided that the correction amount is positive (+), the process goes on to an eighth step ST8 via a sub-step ST6a, and if it is decided that the correction amount is negative (−), the process goes on to the eighth step ST8 via a sub-step ST6b. Meanwhile, if it is decided that the correction amount is zero (0), the process directly goes on to the eighth step ST8.

[Sub-Step ST6a]

A plus bias operation performed when it is decided that the correction amount "d" is positive (+) in the sixth step ST6 will be described by example of a pattern portion having the line width L2 and the space width S2 of Table 1.

Each of all the pattern portions $1L_2$ extracted as those each having the line width L2, which is shown in FIG. 8A, is over-sized by a correction amount d=d22 (for example, +10 nm) corresponding to both the line width L2 and the space width S2, to obtain a correction graphic form 11 shown in FIG. 8B. As shown in FIG. 8C, the plus differential graphic form 5' corresponding to the correction amount d=d22 obtained in the first step ST1 and the correction graphic form 11 are subjected to AND operation, to obtain an AND graphic form 13. As shown in FIG. 8D, the space portion $1S_2$ extracted as that having the target space width S2 in the third step ST3 and the AND graphic form 13 shown in FIG. 8C are subjected to AND operation, to obtain an AND graphic form shown in FIG. 8E, which is taken as a plus bias graphic form 15.

The plus bias operation shown in FIGS. 8A to 8E is repeated for each of those, the correction amount of which is decided as positive (+) in the sixth step ST6, of all the edge portions each having the space width in the range from the space width S1 to the space width Sy (inclusive), to obtain the corresponding plus bias graphic forms 15.

[Sub-Step ST6b]

A minus bias operation performed when it is decided that the correction amount is negative (1) in the sixth step ST6 will be described by way of an example in which it is assumed that in Table 1, a correction amount dy2 corresponding to an edge portion having a line width Ly and a space width S2 is negative.

Each of all the pattern portions $1S_2$ extracted as those each having the space width S2, which is shown in FIG. 9A, is over-sized by a correction amount d=dy2 (for example, −10 nm) corresponding to both the line width Ly and the space width S2, to obtain a correction graphic form 21 shown in FIG. 9B. As shown in FIG. 9C, the minus differential graphic form 5 corresponding to the correction amount (−10 nm) obtained in the first step ST1 and the correction graphic form 21 are subjected to AND operation, to obtain an AND graphic form 23. As shown in FIG. 9D, the pattern portion $1L_y$ extracted as that having the target space width Ly in the third step ST3 and the AND graphic form 23 shown in FIG. 9C are subjected to AND operation, to obtain an AND graphic form shown in FIG. 9E, which is taken as a minus bias graphic form 25.

The minus bias operation shown in FIGS. 9A to 9E is repeated for each of those, the correction amount of which is decided as negative (−) in the sixth step ST6, of all the edge portions each having the space width in the range from the space width S1 to the space width Sy (inclusive), to obtain the corresponding minus bias graphic forms.

[Seventh Step ST7]

In the seventh step ST7, it is decided whether or not a correction amount of each edge portion adjacent to a space portion having an infinite space width (Sz) is positive (+), negative (−), or zero (0). If it is decided that the correction amount is positive (+), the process goes on to the eighth step ST8 via a sub-step ST7a, and if it is decided that the correction amount is negative (−), the process goes on to the eighth step ST8 via a sub-step ST7b. Meanwhile, if it is decided that the correction amount is zero (0), the process directly goes on to the eighth step ST8.

[Sub-Step ST7a]

A plus bias operation performed when it is decided that the correction amount is positive (+) in the seventh step ST7 will be described by way of an example in which it is assumed that in Table 1, a correction amount d2z of a target edge portion having the line width L2 and the space width Sz is positive.

Each of all the pattern portions $1L_2$ extracted as those each having the line width L2, which is shown in FIG. 10A, is over-sized by a correction amount d=d2z (for example, +10 nm) corresponding to both the line width L2 and the space width Sz, to obtain a correction graphic form 31 shown in FIG. 10B. As shown in FIG. 10C, the plus differential graphic form 5' corresponding to the correction amount d=d2z obtained in the first step ST1 and the correction graphic form 31 are subjected to AND operation, to obtain an AND graphic form 33. Space portions $1S_1$ to $1S_y$ other than the space portion having the space width Sz are extracted as shown in FIG. 10D, and as shown in FIG. 10E, the space portions $1A_1$ to $1S_y$ are subtracted from the AND graphic form 33, to obtain a plus bias graphic form 35.

The plus bias operation shown in FIGS. 10A to 10E is repeated for each of those, the correction amount of which is decided as positive (+) in the seventh step ST7, of all the edge portions having the space width Sz, to obtain the corresponding plus bias graphic forms 35.

[Sub-Step ST7b]

A minus bias operation performed when it is decided that the correction amount "d" is negative (−) in the seventh step ST7 will be described by way of an example in which it is assumed that in Table 1, a correction amount dyz corresponding to an edge portion having a line width Ly and a space width Sz is negative.

Each of all the space portions $1S_1$ to $1S_y$ other than the space portion having the space width Sz, which is shown in FIG. 11A, is over-sized by an absolute value of a correction amount d=dyz (for example, −10 nm) corresponding to both the line width Ly and the space width Sz, to obtain a correction graphic form 41 shown in FIG. 11B. As shown in FIG. 11C, the minus differential graphic form 5 corresponding to the correction amount d=−10 nm obtained in the first step ST1 and the correction graphic form 41 are subjected to AND operation, to obtain an AND graphic form 43. The pattern portion $1L_y$ extracted as that having the target space width Ly in the third step ST3, which is shown in FIG. 11D, and the minus differential graphic form 5 corresponding to the correction amount d=−10 nm obtained in the first step ST1 are subjected to AND operation, to obtain an AND graphic form 45 shown in FIG. 11E. The AND graphic form 43 shown in FIG. 11C is subtracted from the AND graphic form 45, to obtain a graphic form shown in FIG. 11F, which is taken as a minus bias graphic form 47.

The minus bias operation shown in FIGS. 11A to 11F is repeated for each of those, the correction amount of which is decided as negative (−) in the seventh step ST7, of all the edge portions each having the space widths Sz, to obtain the corresponding minus bias graphic forms 47.

[Eighth Step ST8]

All of the plus bias graphic forms 15 and 35 and the minus bias graphic forms 25 and 47 obtained by the plus bias operation in the sixth step ST6 and in the seventh step ST7 are subjected to OR operation, to obtain an OR graphic form, and the design pattern 1 and the OR graphic form is subjected to exclusive OR operation, to obtain an XOR (exclusive OR) graphic form.

[Ninth Step ST9]

The XOR graphic form obtained by the graphic form operation in the steps from the first step ST1 to the eighth step ST8 is subjected to micro-recess/micro-projection removal operation. In this case, removal of a micro-recess is performed before removal of a micro-projection.

Figure 12A:
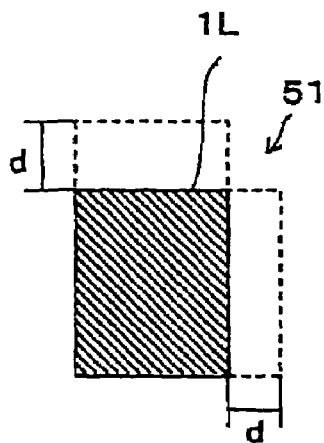
FIGS. 12A to 12C are views illustrating a procedure of correcting a micro-recess after bias correction in accordance with the pattern forming method of the present invention.
Figure 12B:
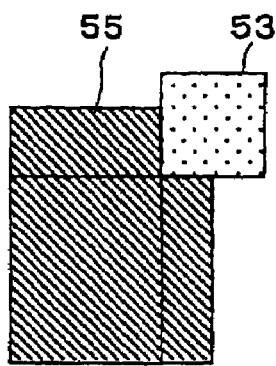
Figure 12C:
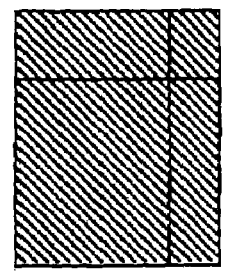

In an example shown in FIG. 12A, a pattern portion 1L has two adjacent edge portions having different space widths, wherein a correction amount "d" of each of the edge portions is positive. In this example, a micro recess 51 is formed at a corner, formed between the two adjacent edge portions, of the pattern portion 1L. The micro-recess 51 is removed as follows: namely, as shown in FIG. 12B, a square-shaped correction graphic form 53 having one side equivalent to the maximum value (for example, d=+20 nm) of the plus correction amounts of the two adjacent edge portions is created at the corner of the pattern portion 1L, and the correction graphic form 53 and the XOR graphic form 55 formed in the eighth step ST8 is subjected to OR operation. Here, if the original correction amount "d" in the XOR graphic form 55 is not the maximum value, the correction graphic form 53 is protruded from the XOR graphic form 55. The protruded portion is removed as shown in FIG. 12C by the next micro-projection correction operation.

In the creation of the correction graphic form 53 shown in FIG. 12B, the correction graphic form 53 may be subjected to movement operation so as to be accurately fitted in the micro-recess 51, as needed. In this case, the movement of the correction graphic form 53 may be moved in consideration of the minimum grid.

Figure 13A:
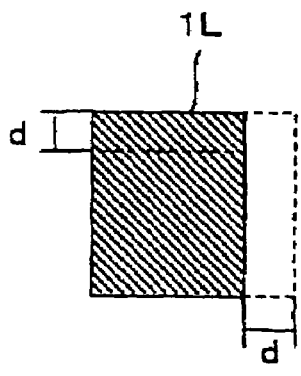
FIGS. 13A to 13C are views illustrating a procedure of correcting a micro-projection after bias correction in accordance with the pattern forming method of the present invention.
Figure 13B:
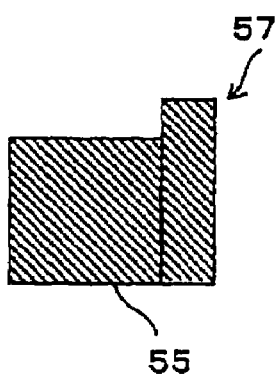
Figure 13C:
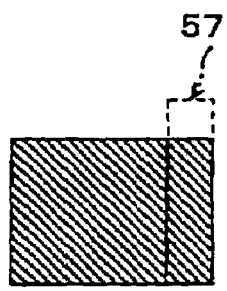
Figure 14:
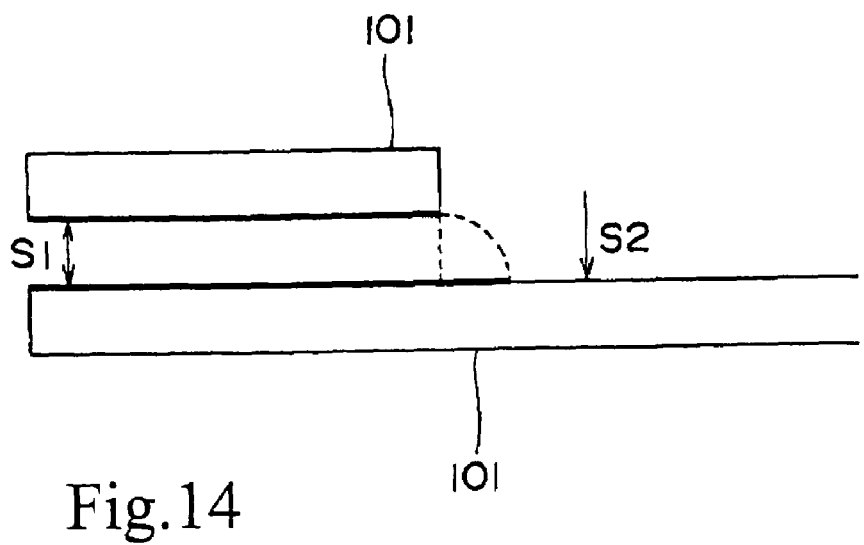
FIG. 14 is a view illustrating a problem of a related art method.

In an example shown in FIG. 13A, a pattern portion 1L has two adjacent edge portions, wherein a correction amount "d" of one of the edge portions is plus and a correction amount "d" of the other is minus. In this example, a micro-projection 57 is formed in an XOR graphic form 55 shown in FIG. 13B. The micro-projection 57 is removed by preparing an absolute value of the maximum value of the minus correction amount with a half of the maximum value of the plus correction amount "d", and under-sizing the XOR graphic form 55 by the larger value and then over-sizing the XOR graphic form 55 by the same amount. The micro-projection 57 is thus removed as shown in FIG. 13C.

The graphic form obtained by the above-described graphic form arithmetic operation in the steps from the first step ST1 to the ninth step ST9 is used as an exposure pattern for photolithography. This exposure pattern, therefore, is that obtained by the rule-based OPC method to which the graphic form arithmetic operation is applied.

According to the above-described exposure pattern forming method, the pattern portions $1L_1$ to $1L_z$ having the target line widths L1 to Lz and the space portions $1S_1$ to $1S_z$ having the target space widths S1 to Sz are extracted by subjecting the design pattern to graphic form arithmetic operation. Accordingly, even for a pattern portion in which the space width of a space around the pattern portion is changed at a point, the space can be accurately separated into two at the changed point, and each of the separated spaced portions can be accurately extracted as that having the corresponding one of the target widths S1 to Sz. As a result, each of the pattern portions or each of the space portions can be accurately extracted as that having the corresponding one of the target line widths L1 to Lz or the corresponding one of the target space widths S1 to Sz irrespective of arrangement states of the pattern portions or the space portions. And, an edge portion of each pattern, which is defined by each pattern portion and each space portion, can be accurately corrected by a correction amount allocated thereto in Table 1.

Since a design pattern is corrected by subjecting each of the extracted portions to graphic form arithmetic operation based on each of correction amounts allocated for each of the target line widths L1 to Lz and the target space widths S1 to Sz, an exposure pattern can be obtained by correcting the design pattern 1 only by graphic form arithmetic operation without use of any special measurement method and correction method. Accordingly, irrespective of the shape of the design pattern, for example, even if a pattern portion is tilted to another pattern portion, such a pattern portion can be corrected on the basis of the shape of the design pattern, to obtain an exposure pattern having smooth tilt lines.

As described above, it is possible to obtain an exposure pattern by accurately correcting a design pattern, and in the case of forming a transfer pattern on a substrate by photolithography using such an exposure pattern, it is possible to certainly prevent occurrence of a defect such as short-circuit between transfer pattern portions and disconnection thereof.

According to the above-described exposure pattern forming method and the exposure pattern, since both extraction of target pattern portions and target space portions and correction of the extracted portions are all performed by graphic form arithmetic operation, it is possible to accurately perform the extraction and correction irrespective of arrangement states of the pattern portions and space portions. Accordingly, it is possible to obtain an exposure pattern by accurately correcting a design pattern, and in the case of forming a transfer pattern on a substrate by photolithography using such an exposure pattern, it is possible to certainly prevent occurrence of a defect such as short-circuit between transfer pattern portions and disconnection thereof.

The invention claimed is:

1. A method of forming an exposure pattern by correcting pattern portions constituting a design pattern by a correction amount, said correction amount previously prepared so as to correspond to both a line width of said pattern portions and a space width of space portions adjacent to said pattern portions, comprising the steps of:

subjecting said design pattern to a graphic form arithmetic operation to extract each of said pattern portions for each of target line widths and to extract each of said space portions for each of target space widths;

subjecting each of said pattern portions extracted for each of said target line widths and said space portions extracted for each of said target space widths to graphic form arithmetic operation, based on the corresponding one of correction amounts, to thereby correct said pattern portions having each of said target line widths for each of said target space widths;

subjecting an edge of said design pattern to enlargement correction by an amount equivalent to ½ of each of said target space widths and then subjecting said edge to reduction correction by the same amount to obtain a correction pattern; and subtracting said design pattern from said correcting pattern to extract a graphic form as a space portion having a space width being equal to or less than said target space width; wherein extraction of said pattern portions is performed in an order from target line widths of larger values to target line widths of smaller values.

2. An exposure pattern forming method according to claim 1, further including the step of:

extracting a difference between two of said space portions obtained by said extraction as a space portion having a target space width in a specific range determined as a range from said target space width of one of said two space portions to said target space width of the other.

* * * * *